(12) United States Patent
Fromson et al.

(10) Patent No.: US 8,133,658 B2
(45) Date of Patent: **\*Mar. 13, 2012**

(54) NON-CHEMICAL DEVELOPMENT OF PRINTING PLATES

(75) Inventors: Howard A. Fromson, Stonington, CT (US); William J. Ryan, North Granby, CT (US); William J. Rozell, Simpsonville, SC (US)

(73) Assignee: Anocoil Corporation, Rockville, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/586,764

(22) Filed: Sep. 28, 2009

(65) Prior Publication Data

US 2010/0089268 A1 Apr. 15, 2010

(51) Int. Cl.
 B41F 7/00 (2006.01)
 G03F 1/00 (2006.01)
 G03F 7/00 (2006.01)

(52) U.S. Cl. .............. 430/302; 430/273.1; 101/450.1; 101/453; 101/463.1

(58) Field of Classification Search .............. 430/302; 101/450.1, 453
See application file for complete search history.

(56) References Cited

U.S. PATENT DOCUMENTS

| | | | |
|---|---|---|---|
| 3,136,637 A | 6/1964 | Larson | 96/75 |
| 3,891,439 A | 6/1975 | Katz et al. | 96/49 |
| 4,058,443 A | 11/1977 | Murata et al. | |
| 4,123,272 A | 10/1978 | Quinn | |
| 4,166,152 A | 8/1979 | Baker et al. | 428/522 |
| 4,186,006 A | 1/1980 | Kobayashi et al. | |
| 4,229,520 A | 10/1980 | Bratt et al. | |
| 4,315,065 A | 2/1982 | Pigeon et al. | |
| 4,329,422 A | 5/1982 | Langlais | |
| 4,370,406 A | 1/1983 | Jones | |
| 4,391,940 A | 7/1983 | Kuhls et al. | 524/458 |
| 4,468,453 A | 8/1984 | Nakamura et al. | |
| 4,533,620 A | 8/1985 | Walls et al. | |
| 4,562,142 A | 12/1985 | Kakumaru et al. | |
| 4,563,410 A | 1/1986 | De Jaeger et al. | |
| 4,612,276 A | 9/1986 | Browne | 430/302 |
| 4,645,730 A | 2/1987 | Fromson et al. | |
| 4,708,925 A | 11/1987 | Newman | |
| 4,956,261 A | 9/1990 | Pawlowski et al. | 430/156 |
| 5,141,841 A | 8/1992 | Wade | 430/281.1 |
| 5,223,041 A | 6/1993 | Cerney | 134/15 |
| 5,252,431 A | 10/1993 | Yoshida et al. | 430/303 |
| 5,254,429 A | 10/1993 | Gracia et al. | 430/162 |
| 6,071,675 A | 6/2000 | Teng | 430/302 |
| 6,359,056 B1 * | 3/2002 | Aurenty et al. | 524/556 |
| 6,387,595 B1 | 5/2002 | Teng | 430/302 |
| 6,482,571 B1 | 11/2002 | Teng | 430/302 |
| 6,548,222 B2 | 4/2003 | Teng | 430/278.1 |

(Continued)

FOREIGN PATENT DOCUMENTS

EP 0 309 619 8/1987

(Continued)

*Primary Examiner* — Cynthia Kelly
*Assistant Examiner* — Chanceity Robinson
(74) *Attorney, Agent, or Firm* — Alix, Yale & Ristas, LLP

(57) ABSTRACT

A solvent-soluble, radiation-polymerizable, oleophilic resin coating non-ionically adhered on a hydrophilic substrate can be imagewise exposed to polymerizing radiation and then directly processed by the application of disruptive mechanical forces such as compression or tension to remove the unimaged areas as undissolved particles, using pressurized water and brushing pre-press, or the tack of the ink on-press.

11 Claims, 5 Drawing Sheets

U.S. PATENT DOCUMENTS

| | | | |
|---|---|---|---|
| 6,576,401 B2 | 6/2003 | Teng | 430/303 |
| 6,590,011 B1 | 7/2003 | Rappoport et al. | 522/170 |
| 6,723,495 B2 | 4/2004 | Ray et al. | |
| 6,727,044 B1 | 4/2004 | Fujimaki et al. | |
| 6,727,045 B2 | 4/2004 | Fuji | |
| 6,740,466 B1 | 5/2004 | Matsumoto et al. | 430/270.1 |
| 6,749,995 B2 | 6/2004 | Matsumura | |
| 6,841,336 B2 | 1/2005 | Kondo | |
| 6,878,505 B2 | 4/2005 | Shibuya | |
| 6,884,561 B2 | 4/2005 | Fromson et al. | |
| 6,899,994 B2 | 5/2005 | Huang et al. | |
| 6,899,998 B2 | 5/2005 | Figov | |
| 6,902,865 B2 | 6/2005 | Teng | 430/302 |
| 6,912,956 B2 | 7/2005 | Mori | 101/459 |
| 7,011,928 B2 | 3/2006 | Takamuki | |
| 7,041,429 B2 | 5/2006 | Ohta et al. | |
| 7,041,431 B2 | 5/2006 | Urano | |
| 7,089,856 B2 | 8/2006 | Teng | 101/451 |
| 7,186,498 B2 | 3/2007 | Gries et al. | 430/331 |
| 7,189,494 B2 | 3/2007 | Knight et al. | 430/281.1 |
| 7,329,058 B1 | 2/2008 | Fromson et al. | 396/611 |
| 7,350,991 B1 | 4/2008 | Fromson et al. | 396/611 |
| 7,358,034 B2 | 4/2008 | Teng | 430/302 |
| 7,427,465 B2 | 9/2008 | Teng | 430/302 |
| 7,645,567 B2 | 1/2010 | Teng | 430/302 |
| 7,655,382 B2 | 2/2010 | Teng | 430/302 |
| 7,674,571 B2 * | 3/2010 | Teng | 430/302 |
| 7,700,266 B2 | 4/2010 | Fromson et al. | 430/302 |
| 7,709,184 B2 | 5/2010 | Teng | 430/302 |
| 7,752,966 B2 | 7/2010 | Teng | 101/451 |
| 7,790,355 B2 | 9/2010 | Teng | 430/302 |
| 7,816,065 B2 | 10/2010 | Fromson et al. | 430/270.1 |
| 7,833,336 B2 | 11/2010 | Valentini | 106/31.75 |
| 7,867,691 B2 | 1/2011 | Fromson et al. | 430/302 |
| 2003/0054282 A1 | 3/2003 | Fromson et al. | 430/165 |
| 2003/0186165 A1 | 10/2003 | Gries et al. | |
| 2003/0207202 A1 | 11/2003 | Fujita et al. | 430/270.1 |
| 2004/0221876 A1 | 11/2004 | Waleh et al. | 134/30 |
| 2005/0018013 A1 | 1/2005 | Nelson et al. | 347/44 |
| 2005/0069811 A1 | 3/2005 | Mitsumoto et al. | |
| 2005/0123853 A1 | 6/2005 | Munnelly et al. | |
| 2005/0130064 A1 | 6/2005 | West et al. | 430/281.1 |
| 2005/0266350 A1 | 12/2005 | Suzuki et al. | |
| 2006/0024614 A1 | 2/2006 | Williamson | |
| 2006/0046191 A1 | 3/2006 | Sakata | |
| 2006/0046199 A1 | 3/2006 | Mitsumoto et al. | |
| 2006/0188814 A1 | 8/2006 | Sakata | |
| 2006/0254738 A1 | 11/2006 | Anderson et al. | 162/175 |
| 2007/0009829 A1 | 1/2007 | Teng | |
| 2007/0072127 A1 | 3/2007 | Teng | |
| 2007/0095232 A1 | 5/2007 | Teng | 101/467 |
| 2007/0101886 A1 | 5/2007 | Teng | |
| 2007/0119323 A1 | 5/2007 | Teng | 101/454 |
| 2007/0172765 A1 | 7/2007 | Teng | 430/302 |
| 2007/0214987 A1 | 9/2007 | Sonokawa et al. | |
| 2007/0254241 A1 | 11/2007 | Teng | 430/302 |
| 2007/0289468 A1 | 12/2007 | Teng | 101/467 |
| 2008/0274429 A1 | 11/2008 | Teng | 430/303 |
| 2008/0280234 A1 | 11/2008 | Teng | 430/325 |
| 2008/0318163 A1 | 12/2008 | Fromson et al. | 430/302 |
| 2009/0025591 A1 | 1/2009 | Teng | 101/450.1 |
| 2009/0061364 A1 | 3/2009 | Teng | 430/432 |
| 2009/0246697 A1 * | 10/2009 | Teng | 430/302 |

FOREIGN PATENT DOCUMENTS

| | | |
|---|---|---|
| EP | 1 020 766 A1 | 1/2000 |

* cited by examiner

NON-CHEMICAL DEVELOPMENT OF PRINTING PLATES

BACKGROUND OF THE INVENTION

The present invention relates to imageable lithographic plates for printing.

Plates of interest have a solvent-soluble, radiation-polymerizable, oleophilic resin coating on a hydrophilic substrate. In conventional practice, after image-wise exposure at ultraviolet (UV), visible, or infrared (IR) wavelengths, the plates are developed with solvent to remove the unexposed areas of the coating by dissolution, thereby producing a substantially planographic pattern of oleophilic and hydrophilic areas. The developed plates are then ready for mounting on a cylinder of a printing press, where the plates are subjected to fountain fluid and ink for transfer of ink to a target surface according to the pattern of oleophilic and hydrophilic areas on the plate.

Although a process is known for developing IR imaged plates with water rather than solvent, the coating is not polymerized by the imaging. Instead, the coating contains microspheres or beads of thermally fusible material suspended in a water-soluble medium or matrix. The plate is imaged at high energy levels (250-350 mj/cm$^2$) such that the microspheres fuse to themselves and the substrate. The imaged plates can be developed with water or fountain fluid on-press, whereby the imaged, fused areas remains intact whereas the unimaged, non-fused areas including microspheres are removed via dissolution of the matrix.

Not only is a high level of energy required for imaging such plates, but the rate of imaging is slow and the resolution is low. Also, the dissolved matrix with microspheres is a chemical waste that must be specially treated.

Thus, it should be appreciated that almost all existing negative-working planographic lithographic printing plates, with the exception of those produced by ablation in the imager, are produced by laying down a continuous film of radiation-sensitive coating on a suitable hydrophilic substrate such as grained, anodized, and hydrophilized aluminum sheet, or its equivalent, imaging the radiation-sensitive coating with actinic ultra-violet, violet, or infra-red energy in an imagewise fashion, and subsequently subtracting the non-irradiated portions of the imaged plate by the process of solubilization or dispersion, thus establishing oleophilic image areas and water receptive non-image areas.

SUMMARY OF THE INVENTION

According to the present invention, we disclose an embodiment in which a planographic lithographic printing plate is produced by laying down a film of radiation-sensitive organic coating on a suitably hydrophilic substrate, such as grained, anodized and hydrophilized coating, or its equivalent, imaging the radiation-sensitive coating with actinic UV, violet, or IR radiation to highly polymerize the image areas and subsequently removing the non-image areas of the imaged plate by mechanically disturbing the planar coating with either the hydraulic energy of a high-pressure water spray, or by bristled brushes rotating rapidly under pressure in an aqueous bath against the plate surface, thus fracturing the coating in the non-image areas into discrete insoluble particles of resin. The fractured particles suspended in water are preferably captured by a powered, rapidly-circulating filter system at a rate at least equal to the particle generation rate.

This state of water insolubility is achieved by composing the organic radiation-sensitive film only of active components that are insoluble in water. The fracturing phenomenon of the imaged organic film is achieved by making certain that the adhesion of the as-coated unimaged organic film to the substrate is less than the internal cohesion of the imaged film. The generation of the removal of the unimaged film in particulate form only is thus attributable to the combined factors that the as-coated coating is not soluble in water and is designed to have an adhesion to the substrate that is less than the cohesion of the as-coated organic layer.

Because the fractured particles, generated by compressive forces in the processor, have not undergone solubilization, they do not adhere to each other to form agglomerates in the processor, nor do they adhere to the rubber, polymer, or metal of the processor or the plate.

In another embodiment, wherein a suitably-coated and imaged plate is to be developed on press, the topcoat of polyvinyl alcohol on the imaged plate is removed in water and the plate is mounted on press in either visible or yellow light. On-press the high-tack press inks adhere very well to the imaged plate surfaces, in both the imaged and unimaged areas. During start-up, when the blanket compresses against the inked-imaged plate surfaces, the high-tack adhesion of the ink to the blanket exceed the adhesion of the unimaged areas of the plate, and the cohesion of the unimaged areas of the plate also exceed the adhesion to the plate, so the fractured non-image particles are deposited on the paper web by the blanket and eventually end up in the initial start-up paper waste. The imaged areas have both adhesion and cohesion greater than the ink and on-press the ink film deposited by the ink form roll onto the plate splits between the imaged areas of the plate and the ink form roll to deposit a coherent image on the blanket from whence it is delivered to the paper.

According to the present innovation, a solvent-soluble, radiation-polymerizable, oleophilic resin coating non-ionically adhered on a hydrophilic substrate can be imagewise exposed to polymerizing radiation and then directly processed by application of mechanical force that removes the non-exposed areas of the coating as particulates, either prepress or on press, without dissolution of the coating material. By subjecting the entire imaged surface to mechanical forces (such as steady compression or tension, or a series of impulses or impacts), the unimaged areas of the coating are mechanically dislodged from the substrate in the form of particulate matter, without any solubilization of the coating.

The mechanical force can be applied by piercing, scraping, pushing or pulling. When applied pre-press at a dedicated developing station or step, such pressure can be in the form of impacts by a pressurized spray of neutral water, or by rapidly rotating bristle brushes, with or without water spray. On press, the tack of ink applied to a newly-installed plate provides sufficient pulling force. In the on-press embodiment, the cohesion of the coating in the unimaged areas exceeds its adhesion to the substrate, and the adhesion of the unimaged coating to the ink is greater than the adhesion to the substrate, such that the blanket pulls the unimaged areas off the substrate and deposits them on the blanket waste.

It should be appreciated that, whereas the active ingredients in the dried, unimaged areas of the coating are only soluble in a non-aqueous solvent, these areas are removed (i.e., the plate is "developed") without use of any such solvent. In this context, "active" means an ingredient that participates in the radiation induced polymerization in the imaged areas. This generally means the active ingredients are a polymer, a monomer and/or oligomer, at least one polymerization or cross link initiator, and a dye.

The most evident advantage is that no separate developing equipment or step is required between the imager and the press. A second significant advantage, whether or not the plate is passed through a pre-press water processor, is that there is little or no chemical treatment required of the waste stream associated with developing the plate. A third significant advantage is that because dissolution of the polymer resin is not relied upon for processing the plate, higher molecular weight resins can be used in the imageable coating, thereby producing more durable oleophilic areas and longer plate life on press.

Two factors play an important role in enabling the removal of the unimaged areas without any solvent or dissolution.

First, the imageable coating as initially applied and dried on the substrate, has a relatively low degree of adhesion to the substrate. This is preferably achieved by using a substrate having a grained, positively charged (anionic) hydrophilic surface to which the coating mildly adheres non-ionically as a result of drying. Such substrate can be a grained aluminum sheet treated with silicate or other known hydrophilizing agents. Drying produces a mild degree of polymerization such that the bottom surface of the coating mechanically interengages and thus adheres to the irregularities in the grained surface of the substrate, and the body of the coating achieves sufficient cohesion to permit further handling, shipment, and imaging of the plates. For on-press development, the cohesion of the dried, unimaged coating is greater than its adhesion to the substrate and its tack or adhesion to the ink and blanket roll is greater than its adhesion to the substrate, but the adhesion of the imaged coating to the substrate is greater than its adhesion to the ink.

Second, upon imaging of the plates, the radiation induced polymerization causes the adhesion and cohesion of the imaged areas to become much higher than the adhesion and cohesion of the unimaged areas. Diazo compounds have been used by some practitioners to increase the adhesion of imaged areas in essentially photopolymerizable coatings. However, the coatings for use in the present invention must be diazo-free, because with diazo based coatings (whether applied in aqueous or non-aqueous solution) the dry coating bonds ionically to the substrate and can only be removed via chemical reaction with non-aqueous (organic) solvent.

Without limiting the scope of the claims corresponding to the inventive concept, we can ascribe the best results at least in part to a combination of non-diazo based resins and associated polymerization initiating agents, which produce low adhesion to the substrate in the manufactured plate yet can quickly produce high adhesion where radiation imaged.

Practitioners in this field had no reason to investigate or optimize the difference in adhesion of non-aqueous photopolymerizable resins as a basis for non-chemical, and especially mechanical, removal of the nonimage areas. Because it was the established practice that nonimage areas of the imaged plate could be substantially completely dissolved by the non aqueous developer solution, the main objective for improving coatings has been to increase the adhesion, cohesion, and durability of the imaged areas and thereby enable the plate to better withstand the rigors of the printing press. Any desired relationship between the imaged and unimaged areas was based on relative solubility, not relative mechanical adhesion, to minimize incidental dissolution of any of the exposed surface the imaged areas while the developer solution dissolved substantially all of the non image areas.

With the present invention, several techniques are available for facilitating or increasing the speed of the removal of the unimaged areas in solidus, i.e., without dissolution.

According to one such technique, the coating also includes as a non-active ingredient, a solvent soluble, partially water soluble, organic compound that is not photosensitive (i.e., it does not harden via photopolymer or photochemical reaction to imaging radiation).

According to another technique, the plates are heated after imaging to increase the difference in cohesion and adhesion of the coating to the substrate as between the imaged and unimaged areas, such that a greater force can be applied to the plates to dislodge only the unimaged areas. In particular, a thermally imageable negative working plate can be exposed to heat for a short period of time after imaging, whereby the imaged portions become more stable and tougher, while the portions of the coating that are to be removed are not significantly affected. The heating step preferably, but not necessarily, immediately follows the imaging step, but can be at a different location from the imaging step.

With yet another technique, any water applied to the plate is at elevated temperature.

In a further preference, the water soluble top coat conventionally used to protect photosensitive (PS) coatings is washed off the PS coating after imaging (and after any subsequent heating step) and the plates stored temporarily until mounted on press. The top coat is typically a water soluble film former (such as PVOH) that prevents atmospheric oxygen from diffusing into the coating and quenching the free radicals necessary for inducing polymerization. The removal of this topcoat has been found to substantially immunize the imaged coating from further polymerization in the unimaged areas due to ambient light. Thus, the plates need not be handled in yellow or other special light between imaging and mounting on press.

The combination of water with pressure produces faster removal of the unimaged areas. Although the mechanism is not known with certainty, it is believed that the coating as applied and dried (and as found in the unimaged areas) inherently contains molecular level interstices that provide paths by which the water can penetrate into the coating and ultimately to the substrate. These interstices may very well be associated with the residual or tail solvent in the dried coating, which can be up to about 5% of the coating by weight. For example, water is miscible with DMF, which if used as a component of the coating solution applied to the substrate, can provide interstices of miscibility in the dried coating. These interstices likely disappear in the imaged areas as a result of the high degree of polymerization. The application of mechanical pressure with water on the relatively soft unimaged areas appears to significantly open up these interstices, and the use of hot water renders the unimaged areas even softer and more easily removable. The paths for water penetration through the interstices of miscibility do not depend on the (optional) presence of a partially water soluble compound in the coating.

In another aspect, the invention is directed to a process for preparing a lithographic plate for offset printing. The steps include selecting a plate having a hydrophilic substrate and an overlying oleophilic, radiation sensitive coating, which coating cross links where exposed to radiation in a particular wavelength range, and imagewise exposing the plate to radiation in that particular wavelength range, thereby producing a pattern of cross linked, highly cohesive oleophilic areas and less cohesive oleophilic areas. The entire coating is then exposed to mechanical force, thereby overcoming the adhesion of and completely dislodging the unimaged areas from the substrate to form a printing plate having an image pattern of cross linked, oleophilic areas of the coating and hydrophilic areas of the substrate.

In yet another aspect, the invention is directed to a printing process in which the imaged plates are developed on press, including selecting a plate having a hydrophilic substrate and an overlying oleophilic, radiation sensitive coating, which coating cross links where exposed to radiation in a particular wavelength range. The next step is imagewise exposing the plate to radiation in that particular wavelength range, thereby producing a pattern of highly cross linked, highly cohesive and highly adhesive oleophilic areas and less cohesive and adhesive oleophilic areas. The plate is mounted on a lithographic printing press cylinder or roll in opposition to an ink cylinder or roll and a blanket roll. Contact of the inked coating with the blanket pulls the ink and less adhesive areas from the plate to form a printing plate having an image pattern of highly cross linked, highly adhesive oleophilic areas of the coating and hydrophilic areas of the substrate.

In a preferred embodiment, the plate is imaged and then passed through a processor in which a high pressure stream of neutral water with optional brush mechanically removes the non imaged areas to achieve accurate pixels densities from about 1% highlights to at least about 95% shadows. The plate is then mounted on press and the combination of ink and blanket roll mechanically cleans out the remaining non imaged areas to achieve accurate shadow densities approaching 99%. The coating removed in the processor is in the form of particles dispersed in the processing water overflow. This dispersion is filtered and the water recycled in the spray.

DESCRIPTION OF THE PREFERRED EMBODIMENTS

Printing Press Process

Figure 1:
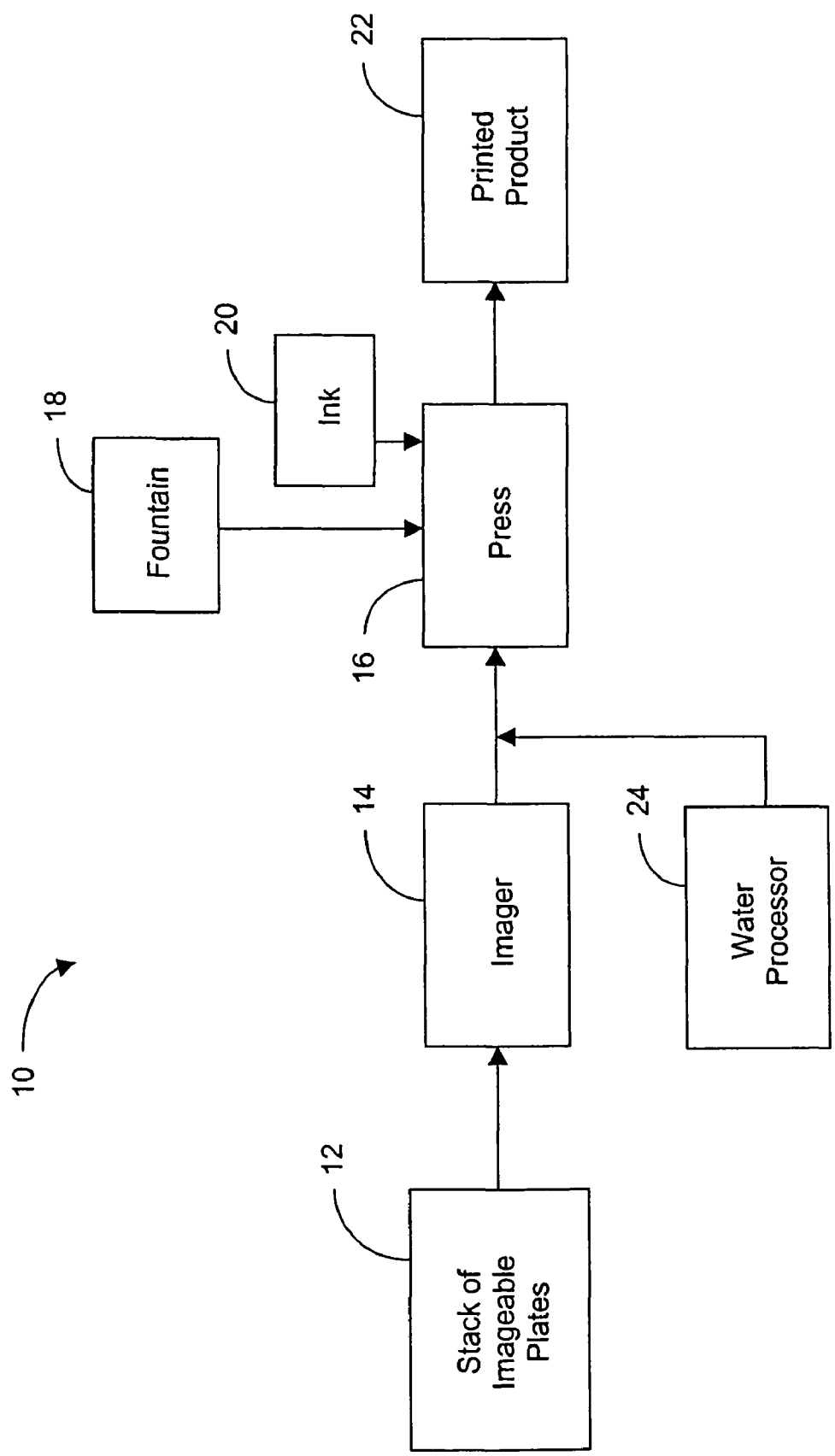
FIG. 1 schematically shows a printing system comprising plate stack, imager, and press.

FIG. 1 shows a schematic of a printing plant 10, such as for newspaper printing, in which a stack of radiation imageable plates 12 is situated upstream of an imager 14, where the coating on the plates is selectively highly cross linked by selective exposure to radiation to form a pattern of highly cohesive and adhesive areas, and areas that exhibit less cohesion and adhesion. The plate substrate is hydrophilic, whereas the coating is oleophilic. The radiation exposure produces high internal cohesion, and high adhesion to the plate. In a conventional negative working system, the original (unimaged) coating is soluble in a specified developer solvent, so the imaged plate must be developed with such solvent to remove the non-exposed areas and thus produce a plate usable in the press. The developer solutions most frequently used contain either some amount of an organic solvent (typically benzyl alcohol) or have an elevated pH (alkaline).

Unlike conventional systems, the present invention delivers the imaged plates directly from the imager 14 to the press 16, wherein contact with the ink form roll 20 and blanket roll (not shown) remove the non-image areas. In another embodiment fountain fluid 18 may also be employed 20. The unimaged coating material is quickly dislodged to reveal areas of the underlying substrate, which have an affinity for fountain fluid, and the retained imaged areas, which have an affinity for ink. Once developed in this manner, the resulting printing plates can be run in the conventional fashion to produce the printed product, which is output at 22.

As an optional configuration, the imaged plates may be sent to a processing station 24, where no special treatment is required other than contact with a spray of pH neutral water (e.g., tap water). A preferred spray can be achieved with a nozzle pressure over about 1000 psi, but if accompanied by brushing or similar wiping action the water pressure can be lower. This wiping can be achieved as part of or immediately after the water processing at 24. The plates can then be dried and stacked, before a fully or substantially fully processed plate is sent to the press 16.

The most evident advantages of the foregoing process, are that no separate developing equipment or step is required between the imager 14 and the press 16, and no resin is dissolved or dispersed into the process water. Rather, all or most of this coating detaches from the substrate in sufficiently large pieces that can be readily removed by filtration and relatively easily disposed of.

Imageable Plate

Figure 2:
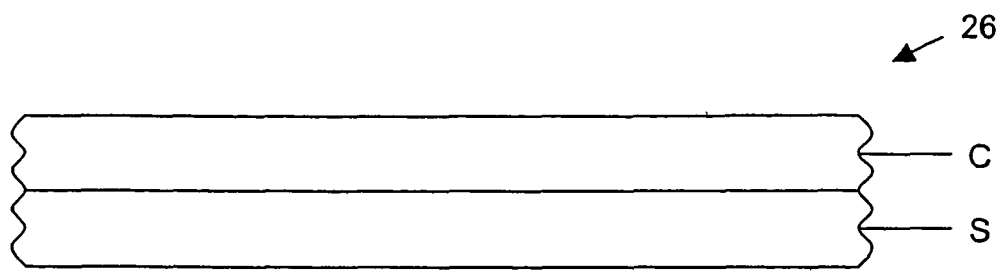
FIG. 2 is a schematic plate cross section showing an imageable coating directly supported on a substrate.

FIGS. 2-6 illustrate schematically, the physical attributes of a plate according to the present invention. FIG. 2 is a schematic section view of the basic embodiment 26, consisting of a substrate or carrier S on which an organic, non-aqueous solvent-based coating C has been applied and dried. The substrate S is preferably a grained, anodized aluminum sheet. The substrate is preferably post treated with a hydrophilizing agent prior to coating. Such post treatments are well known in the art, and include silicate solutions, polyvinylphosphonic acid (PVPA) or amino trimethylenephosphonic acid (ATMPA). The coating C is applied from a solvent soluble composition comprising one or more components capable of cross linking by free radical polymerization. The polymerization arises as a result of imaging with ultraviolet, visible or infrared radiation. As such, the coating may further comprise radiation absorbers and/or initiators to facilitate the cross linking efficiency. None of these active components is soluble in water. Preferred coating compositions further comprise a polymeric material to enhance the oleophilicity and durability of the coating in the ink receptive printing areas.

Figure 3:
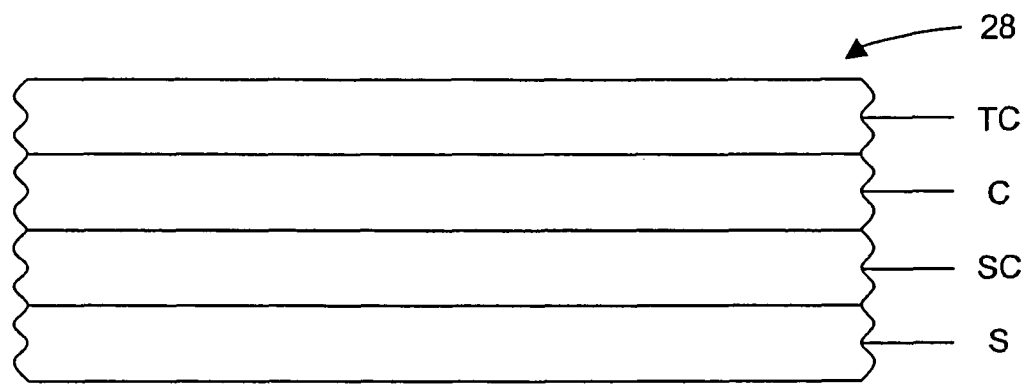
FIG. 3 is a schematic plate cross section showing an imageable plate with a subcoat and top coat.

FIG. 3 is a schematic section view of a plate according to an alternative embodiment where a subcoat SC has been applied to the substrate S, the imageable coating C is applied over the subcoat, and a topcoat TC is applied over the imageable coating. The top coat TC is typically a water soluble film forming layer such as polyvinyl alcohol (PVOH) that serves to prevent atmospheric oxygen from diffusing into the coating and quenching the free radicals. Without the topcoat, the polymerization efficiency is dramatically decreased. The subcoat SC is a water soluble material that facilitates the release of the coating from the substrate in the unimaged areas. The subcoat SC must not adversely impact the adhesion of the coating to the substrate in the imaged areas of the coating. 4-hydroxybenzene sulfonic acid, sodium salt has been found to be particularly suitable as a subcoat.

Figure 4:
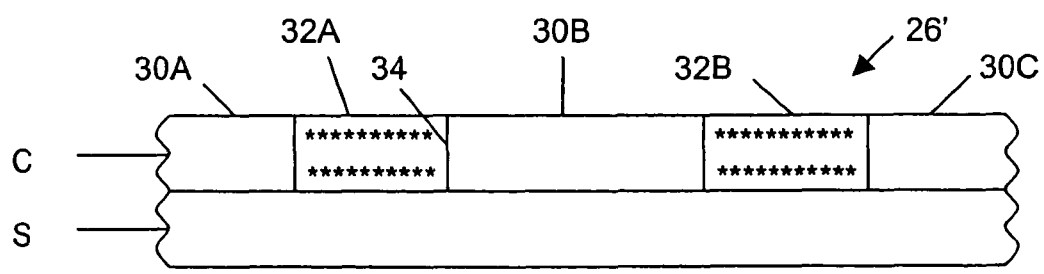
FIG. 4 is a schematic plate cross section upon exposure to radiation.

FIG. 4 corresponds to FIG. 2, and illustrates the effect on the coating of exposure to imaging radiation. The radiation source is preferably a digitally controlled laser, which produces exposure pixels such that a pattern of unexposed coating 38a, 30b, and 30c and exposed coating 32a and 32b covers substantially all of the plate. However, any of the sources of incident imaging radiation used in the art to form selectively written surfaces can be used. The selective imaging results in relatively distinct boundaries 34 at the interface between the imaged and unimaged areas. It should be appreciated that the Figures are not to scale, especially as to relative thickness of the coating and substrate, but are merely illustrative. For the illustrated negative working plate, the exposed coating in areas 32a, 32b becomes highly cross linked, thereby creating areas that have sufficient cohesion and adhesion such that they are not removable by subjecting these areas to substantial mechanical forces or pressure. The unexposed areas 30a, 30b, and 30c retain the original characteristics and properties of the dried coating before imaging. This material is not highly cross linked, and lacks the adhesion to withstand substantial mechanical forces or pressure.

Figure 5:
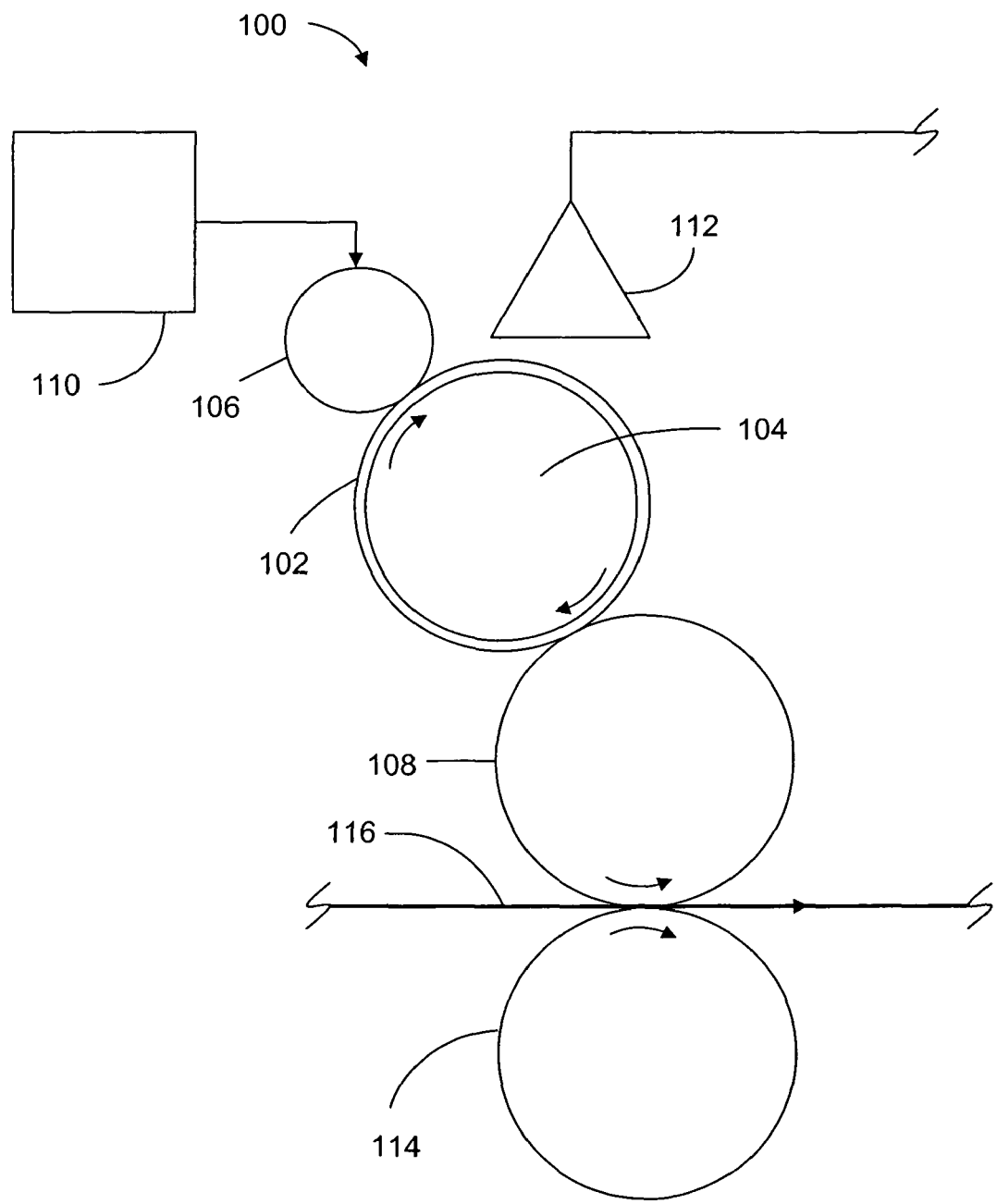
FIG. 5 is a schematic of on-press development of an imaged plate.

FIG. 5 illustrates the context of development on press 100. The imaged plate 102 has been mounted to a plate cylinder 104 in contact opposition to an ink form roll 106 and a blanket roll 108. The ink roll is generally made of rubber and the ink is generally supplied to the ink roll from a source 110 as an emulsion of water in a continuous ink medium. A fountain fluid distributor 112 is provided for the plate cylinder 104 and a rubber roll 114 is in opposition to the blanket roll 108.

During normal printing with a developed printing plate, ink is applied to the rotating plate 102 and it immediately splits, with the ink portion attracted to the oleophilic areas and the water portion attracted to the hydrophilic areas. Fountain fluid is deposited on the upper portion of the plate 102, to further assure that the ink portion and water find the oleophilic and hydrophilic areas, respectively, thereby defining the image pattern of ink to be printed on the target medium (e.g., paper). This pattern of ink is first transferred to the blanket 108, which transfers the ink to the paper 116 as the paper passes between the blanket 108 and the opposed rubber roll 114.

With the present invention, after a new plate 102 is mounted on the plate cylinder 104, the plate cylinder is rotated and the ink form roll 106 is activated, without activation of the fountain fluid supply 112. A film of ink emulsion arises between the ink roll 106 and the entire surface of the plate 102. The continuous ink medium adheres to the entire (oleophilic) surface of the plate, exhibiting sufficient cohesion and adhesion to detach the ink from the ink roll 106. However, the adhesion of the unimaged areas of the plate 102 to the substrate is so low that the blanket 108 pulls the unimaged areas off the substrate, as frangible particles. Thus, the mechanical removal forces are applied by the blanket roll pulling ink and unimaged coating material adhered to the ink, off the substrate. These particles are transferred by the blanket roll 108 to the paper 116. As with conventional startup of a newly installed plate, a paper leader or sacrificial paper sheets are passed through the press during up to a few hundred startup revolutions of the plate roll 104. With the present invention, these startup revolutions completely remove the non-image areas, with all of the removed coating material transferred to the sacrificial sheets 116. These can be disposed of as solid waste, without chemical treatment. After startup, the fountain supply 112 is activated and normal printing begins on the developed plate.

Figure 6:
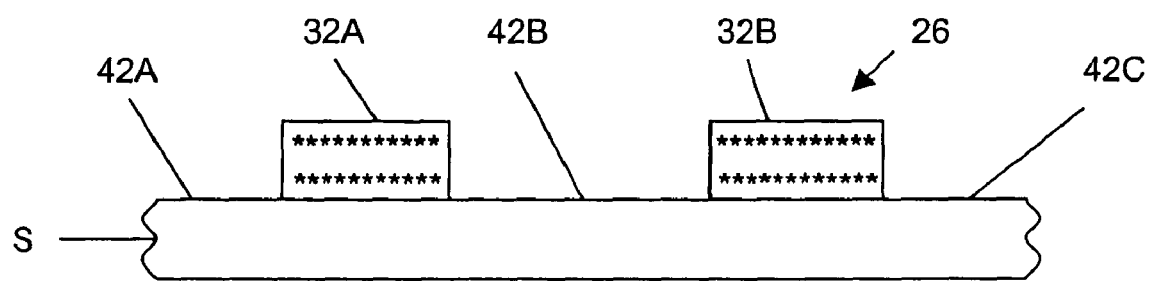
FIG. 6 is a schematic plate cross section showing the pattern of remaining oleophilic imaged areas of the coating and the hydrophilic substrate surface areas where the unimaged areas have been removed in solidus.

FIG. 6 shows a portion the resulting plate 26 (flattened for convenience) ready for production runs with areas 32a and 32b representing the oleophilic coating areas that pick up ink and 42a, 42b, and 42c representing the hydrophilic substrate surfaces that carry the fountain fluid. It is to be understood that the plates and process described herein are essentially planographic and, as noted above, the relative thickness of the areas and surfaces shown in the figures should not be considered as in scale.

Figure 7:
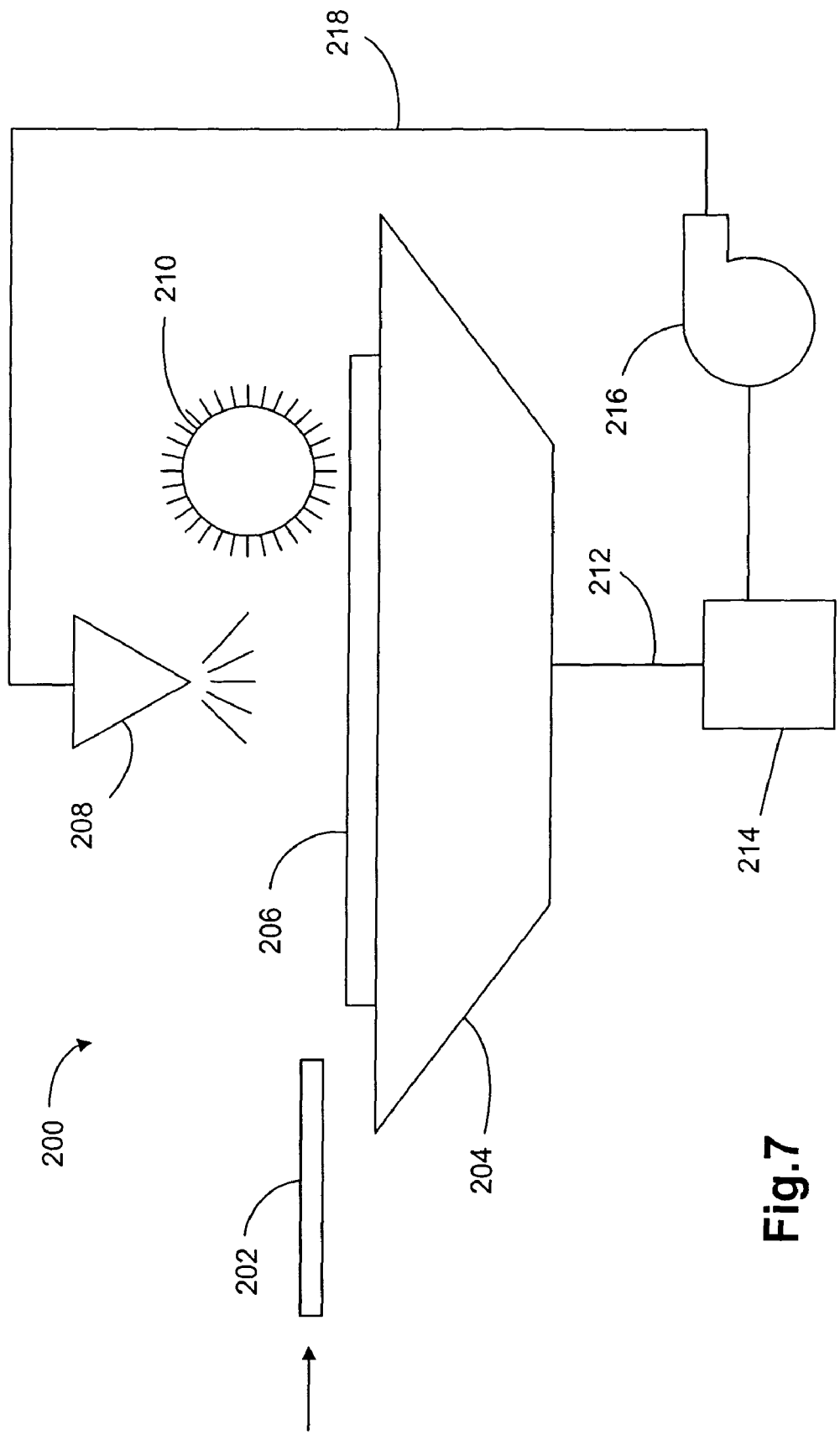
FIG. 7 is a schematic of one embodiment of a pre-press water processor.

FIG. 7 is a schematic of the operative components of one possible processor 200 for the pre-press water development of an imaged plate in a system as depicted in FIG. 1 (where the water processor is indicated at 24). The imaged plate 202 is conveyed over a basin or tank 204 onto a platen 206 or the like. A high pressure spray 208 impinges on the plate surface and mechanically removes the unimaged areas from the substrate, as particles. This removal can be facilitated by the use of hot water in the spray, with or without a rotary brush 210 providing additional impingement on the coating surface. The sprayed water with removed particles is captured in the basin or sump 204 and continuously drained and delivered via line 212 to particle filter 214. The filtered water is recirculated back to the spray nozzle 218 by pump 216 and return line 218. The resinous material removed as particles is trapped in the filter, so there is little or no chemical treatment required of the waste stream associated with developing the plate.

One significant advantage arising from the present invention is that the unimaged areas of the plate have less tendency to retain ink receptive coating residue than on a conventionally developed plate. With conventional development, the coating must be completely dissolved and removed in the developing step. It is sometimes problematic to ensure that all coating is removed from the interstices of the substrate grain. Any residual will remain during the printing process and cause some level of ink pick-up in the background. With the present invention, the coating in the background areas is non-ionically and only mildly adhered to the substrate, so is fully removable. In any event, even a residual of coating material will be removed soon after printing start-up, resulting in a cleaner background.

Another significant advantage of the present invention is that the integrity of the imaged coating is not adversely affected by the processing liquid, i.e., water or fountain fluid. For conventional plates, the imaging process causes a change in the solubility of the coating in the developer. The change is never 100% efficient; that is, even the imaged coating will have some level of solubility in the developer. This residual solubility may significantly alter the adhesive and/or cohesive integrity of the coating. The present invention does not suffer from this problem.

Coating of Representative Embodiment

In one particular embodiment of the invention having the basic configuration shown in FIG. 2, the coating comprises from about 5 to about 30 wt % based on solids content, of a polymer that is generally considered by practitioners of applied chemistry, as insoluble in water. The polymer material may be selected from a wide range of types such as but not limited to acrylates, siloxanes, and styrene maleic anhydrides.

Advantageously, the coating comprises from about 35 to about 75 wt % based on solids content, of a polymerizable monomer, a polymerizable oligomer, or combination thereof that is similarly insoluble in water. Some suitable radically polymerizable (cross linkable) materials are a multifunctional acrylate such as Sartomer 399 and Sartomer 295 commercially available from Sartomer Co.

The coating comprises a non-water-soluble initiator system capable of initiating a polymerization reaction upon exposure to imaging radiation. Some suitable initiator systems comprise a free radical generator such as a triazine or an onium salt.

Optionally but not necessarily, the coating comprises from about 5 to about 15 wt % based on solids content of a "stabilizer" that is soluble in organic solvents and only partially soluble in water. This option may be used when the plates are developed with water pre-press, especially if no brushing is performed. Some suitable stabilizers include a substituted aromatic compound, such as DTTDA (an allyl amide derived from tartaric acid) and tetra methyl tartaramide. The water solubility must not be so great as to overcome the hardening of the imaged areas and compromise the ability of these areas to remain on the plate in the presence a high pressure water spray. The water solubility should be sufficient to facilitate the penetration of water through the unimaged areas.

Additional optional components include dyes that absorb the imaging radiation (e.g. infrared absorbing dyes) and pigments or dyes that serve as colorants in the coating.

The coating advantageously comprises a "release agent" such as 4-hydroxybenzene sulfonic acid, sodium salt 4-HBSA, 4-hydroxybenzoic acid or sodium benzoate. In a different embodiment the release agent is disposed as a subcoating between the hydrophilic substrate and the imageable coating.

Examples

In a first trial at a commercial newspaper printing facility, a negative working, photopolymerizable plate was imaged with IR radiation at 90 mj/cm$^2$ and developed on press during startup as described above, then used in the normal manner to print over 100,000 high quality newspaper sheets. The plate was constituted as follows:
(a) grained, hydrophilized aluminum substrate
(b) imageable coating comprising the raw materials
(i) organic solvent
(ii) polyvinyl butyral polymer resin
(iii) penta functional acrylate monomer
(iv) pigment dispersion
(v) stabilizer
(vi) IR dye
(vii) organo-borate catalyst
(vii) onium salt catalyst
(viii) partially water soluble additive (DTTDA)
(c) PVOH topcoat After thermal imaging, the plate was post-heated. It is believed this step produces further cross linking in the imaged areas but not in the unimaged areas. After cooling, the topcoat was washed off with tap water. Several hours after the topcoat was removed, the plate was mounted on the plate cylinder of a commercial newspaper printing press, with standard news paper, ink roll, blanket roll and rubber roll set up. During startup only the ink roll was active, and the plate was developed and background areas satisfactorily cleaned out within about 300 revolutions of the plate cylinder.

Another trial press run was made with a plate that was identical to that of the first run, except for the omission of the partially water soluble organic compound (DTTDA). The results showed no significant difference.

These trials support the conclusion that unimaged areas can be cleaned out on press corresponding to print dot (pixel) density targets between 0 percent to at least about 98 percent, and most likely at least 99 percent.

If the plates are developed with water and brushing off-press, the targets are achieved between about 0 percent to about 97 percent, but the remaining few percent is achieved by clean out with the ink roll onto the blanket and paper on press.

In a facility where the development is on press, a pre-press water/brush station or localized steam discharge may desirably be adapted to process only an edge or corners of the plate where reference numbers or markers were imaged. The pre-press step will reveal the markers to the press operator for confirmation that the correct plate is to be mounted and properly aligned in the press.

Coating Chemistry Including Enhancement for Water Penetration

The following tables contain descriptions of the coating constituents and variations in the percentage content, associated with multiple examples in which the coating contained a non-photosensitive, solvent soluble, organic compound that is partially soluble in water. The imaged plates were developed by immersion in water and then wiped with a cloth. Although these tests were not performed in a system as depicted in FIGS. 1 and 5 with only mechanical force as the developing agent, the effects of varying the ingredients in a laboratory are believed applicable for optimizing performance in a production setting where mechanical force is proved by a high pressure spray. It should be appreciated, however, that with development according to the invention in a water spray processor or on press, there would be much less tendency of redeposition of removed coating material as reported for some tests.

In each instance, the plates were prepared in a conventional manner in a laboratory, with conventional coating weight of 100 mg/sq.ft., drawn down with a wire wound stainless steel rod, and dried for two minutes at 90° C. All plates had a topcoat of PVOH at 140 mg/sq.ft. All plates having triazine were imageable with UV, and all plates with a dye sensitive to 830 nm light source, such as the KF-1151, were imageable with IR. The results reported with each table are based on conventional IR imaging at about 90-100 mj/sq.cm. A dash in a column indicates that the wt % value is the same as the entry in the previous column of the same row.

If the plates are to be processed in a dedicated station upstream of the press by immersion in water and a wiping action milder than what a plate experiences on-press, the coating could be augmented by a release agent, as shown in Table 1.

Table 2 shows that for a given polymer (Clar. Poly 123) and monomer (Sartomer 399) combination, the relative weight percent is a significant variable. Ratios of monomer to polymer in the range of at least about 1:1 to about 5:1, preferably about 2:1 to about 4:1 are likely to work well, given that the ratio of 0.5:1 (Plate #4) produced only fair results, the ratio of 4:1 (Plate #3) produced excellent results, and the ratio of about 9:1 (Plate #2) produced only fair results.

Table 3 shows the result that satisfactory plates can be made from polymer resins that do not necessarily have a reaction to radiation exposure. The coatings of Plates #1 and #3 have reactive resins that produced good results, and the coatings of Plates #4 and #5 have non-reactive resins that produced good to fair results. The potential for use of non-reactive resins opens the door for use of resins having a much higher molecular weight than presently used resins.

Table 4 demonstrates that not all monomers at a given weight percent of the coating, produce equivalent results, with some producing poor results. Similarly, Table 5 demonstrates that potential stabilizers other than DTTDA that are soluble in the non-aqueous solution and are partially soluble in water, do not necessarily produce satisfactory results.

Table 6 demonstrates that potential release agents other than 4-HBSA that are fully soluble in both non-aqueous solutions and water can be successfully utilized.

Table 7 demonstrates that a coating that is sensitive to both UV and IR radiation can be successfully imaged and processed in water according to the invention.

Table 8 demonstrates that good results do not depend on use of only one kind of initiator.

Table 9 shows that the use of coinitiator compounds and/or post-imaging heating, can improve the performance of the plates.

In Table 9 the organo-borate compound is P3B, made by Showa Denko K.K., headquartered in Tokyo, Japan. The P3B can be used as the sole initiator. It is believed that used individually, the listed initiators would rank from strongest to weakest as Diphenyl Iodonium hexaflouro phosphate, Triazine AC, and P3B. The reason for using a coinitiator system rather then increasing a single initiator is that there is a synergistic effect between the organo-borate and either the triazine or onium catalyst. Given a fixed amount of energy the initiators individually (at their optimum level) will only produce a certain amount of free radicals. However, when the organo-borate is combined with one of the other catalysts, free radicals are generated at a faster rate by the triazine or onium catalyst while free radicals are still generated (at a normal rate) from the organo-borate. Therefore the efficiency of the system is increased in both rate and population. By using this combination, a much higher degree of cross-linking is realized, which improves both adhesion and cohesion of the image. With an increase in adhesion and cohesion, an increased amount of release agent can be used, thereby providing for better development.

Depending on the type of equipment used for the post-imaging thermal enhancement, a different range of times and temperatures should be used. With a convection oven, both the temperature and dwell time are greater than with a small preheat oven unit (where the plate comes in direct contact with the heating element). As a rough guide, 200 deg. F. at 1 minute in a convection oven has approximately the same effect as 175 deg. F. for 7 seconds in a preheat oven. With a typical commercially available preheat unit, the window would be 175 to 250 deg. F. for a time period of 5 to 15 seconds.

Tests were also run on the six formulations shown in Table 9, for comparison of UV versus IR exposures. Previous formulations which did not contain the organo-borate co-initiator system were UV sensitive only when they contained the Triazine AC. The onium salt by itself was not UV sensitive. Incorporating the organo-borate into the formulation rendered the formulations that contained the onium salt UV sensitive. All six of the formulations that contained the co-initiator system produced a good image when exposed to either IR or UV. In order to simplify the testing formulation #5 was chosen for testing in UV exposures.

Using an Ugra scale for comparison, plates were exposed for 250, 125 and 62.5 mjs. The plates were then developed through a water bath with two molleton socks at 4 feet per minute at 75 degrees F. The resulting step wedges were 250 mj—solid 9 steps with 2 gray steps to a total of 11, 125 mj—solid 7 steps with 2 gray steps to a total of 9 and 62.5 mj—solid 5 steps with 2 gray steps to a total of 7. All of the images from the different exposures exhibited very good solvent resistance. The best resolution that was received was at 62.5 mjs, which yielded an open 15 micron line target and good screen values from 2% to 99%.

TABLE 1

Coating Compositions With Partially Water Soluble Stabilizer As the Significant Variable 4-Hydroxy B S A and DTTDA

|  | #1) | #2) | #3) | #4) | #5) | #6) |
|---|---|---|---|---|---|---|
| Meth. Prop [a] | 92.39% | 91.99% | 92.27% | 91.77% | 91.77% | 91.77% |
| Sartomer 399 [b] | 2.31% | 2.31% | 2.31% | 2.31% | 2.31% | 2.31% |
| Clariant Poly 123 [c] | 0.46% | 0.46% | 0.46% | 0.46% | 0.46% | 0.46% |
| Triazine AC [d] | 0.45% | 0.45% | 0.45% | 0.45% | 0.45% | 0.45% |
| DTTDA [e] | 0.00% | 0.40% | 0.00% | 0.40% | 0.52% | 0.00% |
| 4-HBSA [f] | 0.00% | 0.00% | 0.12% | 0.12% | 0.00% | 0.52% |
| KF-1151 [g] | 0.05% | 0.05% | 0.05% | 0.05% | 0.05% | 0.05% |
| Pigment Disp [h] | 4.34% | 4.34% | 4.34% | 4.34% | 4.34% | 4.34% |
|  | 100.0% | 100.0% | 100.0% | 100.0% | 100.0% | 100.0% |

[a] Solvent (1-Methoxy-2-Propanol, Propylene Glycol Methyl Ether available from Arco Chemical Company)
[b] Monomer (Dipentaerythritol Monohydroxypentaacrylate available from Sartomer Company, West Chester, Penn.)
[c] Polymer
[d] Initiator
[e] Stabilizer
[f] Release Agent
[g] Dye
[h] Pigment

RESULTS

1) Plate would not develop

2) Plate showed slight signs of development

3) Plate had partial development with heavy redeposition

4) Plate developed very easily producing an image with good adhesion, good dot reproduction and a clean background.

5) Plate did not develop any better than plate #2

6) Plate developed in a very non uniform way yielding a weak image and redeposition

TABLE 2

Coating Compositions With Monomer/Polymer Ratio as the Significant Variable

Monomer/Polymer Ratio

| | #1) | #2) | #3) | #4) | #5) | #6) |
|---|---|---|---|---|---|---|
| Meth. Prop. | 92.39% | — | — | — | — | — |
| Sartomer 399 | 2.77% | 2.49% | 2.21% | 1.85% | 0.92% | 0.00% |
| Clar. Poly 123 | 0.00% | 0.28% | 0.56% | 0.92% | 1.85% | 2.77% |
| Triazine AC | 0.45% | — | — | — | — | — |
| DTTDA | 0.40% | — | — | — | — | — |
| 4-HBSA | 0.12% | — | — | — | — | — |
| KF-1151 | 0.05% | — | — | — | — | — |
| Pigment Disp. | 4.34% | — | — | — | — | — |
| | 100.0 | 100.0 | 100.0 | 100.0 | 100.0 | 100.0 |

Results:
1) Plate produced a good image but the plate was easily over developed. The coating was slow in speed and had poor adhesion to the substrate.
2) Produced a better image than #1 with faster speed but it was still easy to over develop but with better adhesion.
3) Produced a strong image with good adhesion. The coating developed very easily with good dot reproduction and clean background.
4) Produced a very strong image with great adhesion. The coating was more difficult than #3 to develop but had good dot reproduction and a clean background. There was also some evidence of redeposition.
5) Plate showed only very slight development.
6) Plate had no development.

TABLE 3

Coating Compositions With Radiation Sensitive Resin As the Significant Variable

Reactive and Non Reactive Resins

| | #1) | #2) | #3) | #4) | #5) | #6) |
|---|---|---|---|---|---|---|
| Meth. Prop. | 92.39% | — | — | — | — | — |
| Sartomer 399 | 2.21% | — | — | — | — | — |
| Triazine AC | 0.45% | — | — | — | — | — |
| DTTDA | 0.40% | — | — | — | — | — |
| 4-HBSA | 0.12% | — | — | — | — | — |
| KF-1151 | 0.05% | — | — | — | — | — |
| Pigment Disp. | 4.34% | — | — | — | — | — |
| Clar. Poly 123 | 0.56% | — | — | — | — | — |
| Jaylink 106 | — | 0.56% | — | — | — | — |
| NK-P1002 | — | — | 0.56% | — | — | — |
| Dow Corning 62230 | — | — | — | 0.56% | — | — |
| Sartomer PRO5542 | — | — | — | — | 0.56% | — |
| 4-vinylphenol/MMac. | — | — | — | — | — | 0.56% |
| | 100.0 | 100.0 | 100.0 | 100.0 | 100.0 | 100.0 |

Results:
1) Produced an image with good dot reproduction and adhesion along with a clean background. Coating was easy to develop.
2) Coating was difficult to develop and produced a broken image with poor adhesion. The background of the plate was clean.
3) The coating was slightly more difficult to develop then #1 but produced an image with good adhesion but significant coating re-deposited on the image. The background area of the plate was clean.
4) This resin (non photo reactive) produced a coating that was easy to develop. The image had good dot reproduction and good adhesion. The image was prone to over development. The background areas of the plate were clean.
5) This resin (non photo reactive) produced a coating that was easy to develop without being over sensitive. The image had good dot reproduction and good adhesion. The background areas of the plate were clean.
6) This resin (non photo reactive) produced a coating that was very difficult to develop. Could not get good dot reproduction or a clean background.

TABLE 4

Coating Compositions With Monomer Type as the Significant Variable

Monomers

| | #1) | #2) | #3) | #4) | #5) | #6) |
|---|---|---|---|---|---|---|
| Meth. Prop. | 92.39% | — | — | — | — | — |
| Clar. Poly 123 | 0.28% | — | — | — | — | — |
| Triazine AC | 0.45% | — | — | — | — | — |
| DTTDA | 0.40% | — | — | — | — | — |
| 4-HBSA | 0.12% | — | — | — | — | — |
| KF-1151 | 0.05% | — | — | — | — | — |
| Pigment Disp. | 4.34% | — | — | — | — | — |
| SR-399 | 2.49% | — | — | — | — | — |

TABLE 4-continued

Coating Compositions With Monomer Type as the Significant Variable
Monomers

|         | #1) | #2)   | #3)   | #4)   | #5)   | #6)   |
|---------|-----|-------|-------|-------|-------|-------|
| SR-454  | —   | 2.49% | —     | —     | —     | —     |
| SR-350  | —   | —     | 2.49% | —     | —     | —     |
| SR-295  | —   | —     | —     | 2.49% | —     | —     |
| CD-580  | —   | —     | —     | —     | 2.49% | —     |
| SR-348  | —   | —     | —     | —     | —     | 2.49% |
|         | 100.0 | 100.0 | 100.0 | 100.0 | 100.0 | 100.0 |

Results:
1) (SR-399 Dipentaerythritol Pentaacrylate) This monomer produced a coating that was easy to develop. The image was strong with good dot reproduction and good adhesion. The background area was very clean. The image was slightly sensitive to overdevelopment.
2) (SR-454 Ethoxylated Trimethylolpropane Triacrylate) This monomer produced a coating that was very easy to develop but had a weak image and a dirty background.
3) (SR-350 Trimethylolpropane Triacrylate) This monomer produced a coating that was somewhat difficult to develop. The resulting image was strong but with heavy retention in Background.
4) (SR-295 Pentaerythritol Triacrylate and Tetraacrylate) This Mixture of monomers produced a coating that was almost as As easy as #1 to develop. The image was slightly weaker then #1 but the background was clean.
5) (CD-580 Alkoxylated Cyclohexane Dimethanol Diacrylate) This monomer produced a coating that did not develop.
6) (SR-348 Ethoxylated Bisphenol A Dimethacrylate) This monomer produced a coating that was very difficult to get any development.

TABLE 5

Coating Compositions With DTTDA and other Partially Soluble Stabilizers As the Significant Variable
DTTDA and Analogous Compounds

|                          | #1)   | #2)   | #3)   | #4)   | #5)   | #6)   |
|--------------------------|-------|-------|-------|-------|-------|-------|
| Meth. Prop.              | 92.39 | —     | —     | —     | —     | —     |
| Sartomer 399             | 2.31  | —     | —     | —     | —     | —     |
| Clar. Poly 123           | 0.46  | —     | —     | —     | —     | —     |
| Triazine AC              | 0.45  | —     | —     | —     | —     | —     |
| 4-HBSA                   | 0.12  | —     | —     | —     | —     | —     |
| KF-1151                  | 0.05  | —     | —     | —     | —     | —     |
| Pigment Disp.            | 4.34  | —     | —     | —     | —     | —     |
| DTTDA                    | 0.40  | —     | —     | —     | —     | —     |
| Dimethyl Tartrate        | —     | 0.40  | —     | —     | —     | —     |
| Di allyl Maleate         | —     | —     | 0.40  | —     | —     | —     |
| Di allyl Succinate       | —     | —     | —     | 0.40  | —     | —     |
| Dimethyl Maleate         | —     | —     | —     | —     | 0.40  | —     |
| Tetra Methyl Tartaramide | —     | —     | —     | —     | —     | 0.40  |
|                          | 100.0 | 100.0 | 100.0 | 100.0 | 100.0 | 100.0 |

Results:
1) Good development, good image and clean background.
2) Hard to develop, strong image and dirty background.
3) Very slight development.
4) No development
5) No development
6) As good as #1

TABLE 6

Coating Compositions With 4HBSA and Other Soluble Release Agents As the Significant Variable
4-Hydroxy B.S.A. and Analogous compounds

|                     | #1)   | #2)  | #3)  | #4)  |
|---------------------|-------|------|------|------|
| Meth. Prop.         | 92.39 | —    | —    | —    |
| Sartomer 399        | 2.31  | —    | —    | —    |
| Clar. Poly 123      | 0.46  | —    | —    | —    |
| Triazine AC         | 0.45  | —    | —    | —    |
| DTTDA               | 0.40  | —    | —    | —    |
| KF-1151             | 0.05  | —    | —    | —    |
| Pigment Disp.       | 4.34  | —    | —    | —    |
| 4-HBSA              | 0.12  | —    | —    | —    |
| Benzene Sul. Acid   | —     | 0.12 | —    | —    |
| 4-Hydroxy Benzoic Acid | — | —    | 0.12 | —    |
| Sodium Benzoate     | —     | —    | —    | 0.12 |
|                     | 100.0 | 100.0 | 100.0 | 100.0 |

Results:
1) Control formula—produced a coating that was easy to develop. The image was strong and the background was clean.
2) The coating was not as easy to develop but the image was strong and the background was somewhat clean.
3) This material produced a coating that was as good or better than the control.
4) This coating was equivalent to #2.

TABLE 7

Coating Compositions With Various Infrared Sensitive Dyes As the Significant Variable
Various 830 Dyes

|  | #1) | #2) | #3) | #4) |
|---|---|---|---|---|
| Meth. Prop. | 92.39 | — | — | — |
| Sartomer 399 | 2.31 | — | — | — |
| Clar. Poly 123 | 0.46 | — | — | — |
| Triazine AC | 0.45 | — | — | — |
| DTTDA | 0.40 | — | — | — |
| 4-HBSA | 0.12 | — | — | — |
| Pigment Disp. | 4.34 | — | — | — |
| KF-1151 | 0.05 | — | — | — |
| ADS-WS | — | 0.05 | — | — |
| Few Chem S0456 | — | — | 0.05 | — |
| Few Chem S0306 | — | — | — | 0.05 |
|  | 100.0 | 100.0 | 100.0 | 100.0 |

Results:
1) This is the control coating which developed easily and produced a good image and clean background.
2) This coating was equivalent to #1 except that the image was not quite as strong.
3) This coating developed easily but did not produce any image.
4) This coating developed easily but produced a very weak image.
Observation; Although not all of the coatings produced an image in the IR all of them did produce strong images in the UV.

TABLE 8

Coating Compositions With Triazine vs. Onium Salts As the Significant Variable for Cross Linking Initiators
Initiators: Triazine Vs. Onium Salts

|  | #1) | #2) | #3) |
|---|---|---|---|
| Meth. Prop. | 92.39 | — | — |
| Sartomer 399 | 2.31 | — | — |
| Clar. Poly 123 | 0.46 | — | — |
| DTTDA | 0.40 | — | — |
| 4-HBSA | 0.12 | — | — |
| KF-1151 | 0.05 | — | — |
| Pigment Disp. | 4.34 | — | — |
| Triazine AC | 0.45 | — | — |
| Diphenyl Iod. PF6 | — | 0.45 | — |
| CD1012 | — | — | 0.45 |
|  | 100.0 | 100.0 | 100.0 |

Results:
1) This is the control formulation which was easy to develop and produced a strong image with a clean background.
2) This formula (with Diphenyliodonium Hexafluorophosphate) developed easier then the control and still produced a strong image with a clean background.
3) This formulation was slightly more difficult to develop than the control. It produced a strong image but a slightly dirty background. (Diaryliodonium Hexaflouroantimonate)

TABLE 9

Post-Imaging Thermal Enhancement and Coating Compositions with Co-Initiators

|  | #1) | #2) | #3) | #4) | #5) | #6) |
|---|---|---|---|---|---|---|
| Meth. Prop. | 91.87% | 91.77% | 91.25% | 91.87% | 91.77% | 91.25% |
| Sartomer 399 | 2.46% | 2.46% | 2.46% | 2.46% | 2.46% | 2.46% |
| Clar. Poly 123 | 0.31% | 0.31% | 0.31% | 0.31% | 0.31% | 0.31% |
| DTTDA | 0.40% | 0.40% | 0.80% | 0.40% | 0.40% | 0.80% |
| 4-HBSA | 0.12% | 0.12% | 0.24% | 0.12% | 0.12% | 0.24% |
| KF-1151 | 0.05% | 0.05% | 0.05% | 0.05% | 0.05% | 0.05% |
| Pigment Disp. | 4.34% | 4.34% | 4.34% | 4.34% | 4.34% | 4.34% |
| Showa D. 3PB | — | 0.10% | 0.10% | — | 0.10% | 0.10% |
| Triazine AC | 0.45% | 0.45% | 0.45% | — | — | — |
| Diphnly Iod. PF6 | — | — | — | 0.45% | 0.45% | 0.45% |
| Total | 100.0 | 100.0 | 100.0 | 100.0 | 100.0 | 100.0 |

Results:
1a) This is a control type coating formula which developed easily and produced a good image and clean background. The run length of this image was very susceptible to press type and conditions.
1b) Using the same coating formula the plate was put through a pre-heat of 100 degrees C. for 1 minute prior to being mounted on press. The plate still had good development (slightly less then #1a) but had an image that was less susceptible to the type of press and its condition.
2a) This is the control formulation but with the addition of a small amount of an organo-borate compound (Showa D. 3PB) used as a co-initiator. This plate took longer to develop than plates 1a or 1b but had a much more durable image. This coating was much less sensitive to press type or conditions and also had better run length than 1b.
2b) Using the same coating formula as 2a the plate was put through a pre-heat of 100 degrees C. for 1 minute prior to being mounted on press. The plate was slower to develop than 2a and although the image was much tougher the background was not as clean causing the plate to print with a background tone.
3a) This coating was the same as #2 but the amount of DTTDA and 4-HBSA was doubled, which with the use of the organo-borate allowed the plate to have good development characteristics along with a good image. This made it easier to develop then 2a but it did not have as tough an image.
3b) This is coating 3a but the plate was exposed to a pre-heat of 100 degrees C. (for 1 minute) prior to being mounted on the press. This plate had a very tough image but was slower to develop then 3a and did not have a completely clean background.
4a) This is the same as formula #1 but the Triazine AC was replaced with the onium salt Diphenyl Iodonium Hexa-Flouro Phosphate. This change not only allowed the plate to develop faster on press but it also produced a slightly better image then #1 with a good clean background.
4b) This is coating 4a except the plate was exposed to a pre-heat of 100 degrees C. for 1 minute prior to mounting on press. The plate developed as fast as #1 having a strong image with good integrity. The plate had a decent run but was still somewhat susceptible to press conditions.
5a) This is the same as coating 4a except for the organo-borate. The plate produced from this coating was slower to develop than plate 4a. It had a good image with a clean background.
5b) This is coating 5a with a preheat of 100 degrees C. for 1 minute prior to mounting on press. This coating developed at approximately the same speed as 5a. The image was very strong with good integrity but the background printed with a very slight tone.
6a) This is coating formula #5 with double the amount of the DTTDA and 4-HBSA. These plates had a good roll up on press with a clean background. The image was sound but not quite as strong as #5.

TABLE 9-continued

Post-Imaging Thermal Enhancement and Coating Compositions with Co-Initiators

| #1) | #2) | #3) | #4) | #5) | #6) |
| --- | --- | --- | --- | --- | --- |

6b) These plates were coated with the formula of #6 but were exposed to a pre-heat prior to being mounted on press. In the previous pre-heat trials the plates could not exceed a temperature of 100 degrees C. without either losing a clean background or loss of development altogether. With the increase in the developing aids the plates were able to take a pre-heat of 120 degrees C. for 1 minute and still maintain good development with a strong image and a clean background.

Coating Chemistry without Enhancement for Water Penetration

Although the Tables above were based on varying the components of a composition which included a solvent soluble, partially water soluble organic compound, the effects of these variations are likely to be instructive for compositions without such organic compound. It should be appreciated that a key aspect of the embodiment without the partially water soluble organic compound, is that the cohesion of the unimaged coating is greater than the adhesion of the unimaged coating to the substrate. Some compositions in the foregoing tables that show promise (because of the efficacy of the partially soluble compound) may not be suitable for this embodiment if the adhesion is not less than the cohesion, however, one of ordinary skill in the art can readily select and optimize many of the compositions in the Tables by omitting the partially water soluble organic compound.

There are many types of resins, oligomers and monomers that can be used to produce coatings that would have properties suitable for use in the present invention. It is believed that the monomer to polymer ratio in the range of 2-4 and the use of an organo-borate catalyst with an onium salt catalyst are important preferences. A wide mixture of functionalities can be used but dried coatings with better adhesion and cohesion are achieved with multi functional monomers and oligomers (functionality of 3 or higher). It is not necessary to use a resin which contains unsaturated groups but in the majority of the cases the cured film will exhibit better adhesion and integrity. Types of resins can include poly vinyls (poly vinyl acetate, poly vinyl butyral, etc), cellulosic, epoxies, acrylics and others as long as the resin does not produce a strong adhesive bond with the substrate. Monomers and oligomers should be somewhat viscous liquids and can be polyester/polyether, epoxy, urethane acrylates or methacrylates (such as polyether acrylate, polyester acrylate, modified epoxy acrylate, aliphatic urethane methacrylate, aliphatic urethane acrylate oligomers, polyester acrylate oligomers, aromatic urethane acrylate, dipentaerythritol pentaacrylate, pentaacrylate ester, etc.).

The invention claimed is:

1. A process for developing a lithographic plate, comprising:
   (a) selecting an imaged plate having
      (i) a substrate with a grained, anodized, hydrophilic surface;
      (ii) a negative working, organic, polymerizable coating in which all active components for polymerization are insoluble in water;
      (iii) wherein said coating is non-ionically bonded to the substrate and has been imaged by polymerization in areas exposed to radiation, such that the cohesion of the unimaged areas of the coating exceeds the adhesion of the unimaged areas of the coating to the substrate; and
   (b) subjecting the entire coating to mechanical forces which disrupt and remove only the unimaged areas of the coating from the substrate in the form of particulate material and without solubilization of either the imaged or unimaged areas of the coating, wherein
   the mechanical forces are provided by pulling on the coating.

2. A process for developing a lithographic plate, comprising:
   (a) selecting an imaged plate having
      (i) a substrate with a grained, anodized, hydrophilic surface;
      (ii) a negative working, organic, polymerizable coating in which all active components for polymerization are insoluble in water;
      (iii) wherein said coating is non-ionically bonded to the substrate and has been imaged by polymerization in areas exposed to radiation, such that the cohesion of the unimaged areas of the coating exceeds the adhesion of the unimaged areas of the coating to the substrate; and
   (b) subjecting the entire coating to mechanical forces which disrupt and remove only the unimaged areas of the coating from the substrate in the form of particulate material and without solubilization of either the imaged or unimaged areas of the coating, wherein
   the plate is on a rotating cylinder of a printing press having an ink roll that applied ink to the coating and a rotating blanket roll that is in contact with the coating; and
   the mechanical forces are applied by the blanket roll pulling ink and unimaged coating material adhered to the ink, off the substrate.

3. A process for developing a lithographic plate, comprising:
   (a) selecting an imaged plate having
      (i) a substrate with a grained, anodized, hydrophilic surface;
      (ii) a negative working, organic, polymerizable coating in which all active components for polymerization are insoluble in water;
      (iii) wherein said coating is non-ionically bonded to the substrate and has been imaged by polymerization in areas exposed to radiation, such that the cohesion of the unimaged areas of the coating exceeds the adhesion of the unimaged areas of the coating to the substrate; and
   (b) subjecting the entire coating to mechanical forces which disrupt and remove only the unimaged areas of the coating from the substrate in the form of particulate material and without solubilization of either the imaged or unimaged areas of the coating, wherein the active components include,
   from about 5 to about 30 wt % based on solids content, of a polymer;
   from about 35 to about 75 wt % based on solids content, of a radically polymerizable, multifunctional acrylate monomer or oligomer; and
   an initiator system capable of initiating a polymerization reaction upon exposure to imaging radiation.

4. The process of claim 3, wherein the initiator system comprises a combination of one of triazine or an onium salt with an organo-borate compound.

5. A process for developing a lithographic plate, comprising:
- (a) selecting an imaged plate having
    - (i) a substrate with a grained, anodized, hydrophilic surface;
    - (ii) a negative working, organic, polymerizable coating in which all active components for polymerization are insoluble in water;
    - (iii) wherein said coating is non-ionically bonded to the substrate and has been imaged by polymerization in areas exposed to radiation, such that the cohesion of the unimaged areas of the coating exceeds the adhesion of the unimaged areas of the coating to the substrate; and
- (b) subjecting the entire coating to mechanical forces which disrupt and remove only the unimaged areas of the coating from the substrate in the form of particulate material and without solubilization of either the imaged or unimaged areas of the coating, wherein the coating components include,
    - (a) polyvinyl butyral resin
    - (b) penta functional acrylate monomer
    - (c) pigment dispersion
    - (d) stabilizer
    - (e) IR dye
    - (f) organo-borate catalyst and
    - (g) onium salt catalyst.

6. A process for preparing a lithographic plate for offset printing, comprising the sequence of:
- (a) selecting a plate having an anodized, hydrophilic substrate and an overlying oleophilic, radiation polymerizable, non-aqueous organic coating non-ionically adhered to the substrate, wherein the cohesion of the coating to itself is greater than the adhesion of the coating to the substrate;
- (b) imagewise exposing the plate to radiation, thereby producing a pattern of highly polymerized oleophilic imaged areas and unimaged oleophilic areas; and
- (c) mechanically impinging the entire coating in a water environment supplied by a source of water, with sufficient energy to disrupt and dislodge the unimaged areas from the substrate and thereby remove the unimaged areas from the substrate in the form of discrete solid particles, including distributing the removed particles in water;

filtering the particles from the water; and recirculating the filtered water back to the water source at a rate that maintains the water in the source in a substantially particle-free state.

7. The process of claim 6, wherein between steps (b) and (c), the entire imagewise exposed plate is exposed to elevated temperature in the range of between about 175 to 250 degrees F. for a time period in the range of 5 to 15 seconds.

8. The process of claim 6, wherein step (c) is performed with a high-pressure water spray.

9. The process of claim 6, wherein step (c) is performed with a rotating brush.

10. A process for preparing a lithographic plate for offset printing, comprising the sequence of:
- (a) selecting a plate having an anodized, hydrophilic substrate and an overlying oleophilic, radiation polymerizable, non-aqueous organic coating non-ionically adhered to the substrate, wherein the cohesion of the coating to itself is greater than the adhesion of the coating to the substrate;
- (b) imagewise exposing the plate to radiation, thereby producing a pattern of highly polymerized oleophilic imaged areas and unimaged oleophilic areas; and
- (c) mechanically impinging the entire coating in a water environment supplied by a source of water, with sufficient energy to disrupt and dislodge the unimaged areas from the substrate and thereby remove the unimaged areas from the substrate in the form of discrete solid particles, wherein the imaging radiation is in the infra-red wavelength range and the imaging is at an energy level no greater than about 125 mj/cm$^2$.

11. A process for preparing a lithographic plate for offset printing, comprising the sequence of:
- (a) selecting a plate having an anodized, hydrophilic substrate and an overlying oleophilic, radiation polymerizable, non-aqueous organic coating non-ionically adhered to the substrate, wherein the cohesion of the coating to itself is greater than the adhesion of the coating to the substrate;
- (b) imagewise exposing the plate to radiation, thereby producing a pattern of highly polymerized oleophilic imaged areas and unimaged oleophilic areas;
- (c) mechanically impinging the entire coating in a water environment supplied by a source of water, with sufficient energy to disrupt and dislodge the unimaged areas from the substrate and thereby remove the unimaged areas from the substrate in the form of discrete solid particles without dissolution, resulting in a plate with highlights and shadows in the range of about 1% to at least about 95%;
- (d) mounting the plate on a plate cylinder of a lithographic printing press;
- (e) applying ink to the mounted plate with an ink form roll as the plate is rotated in contact with a rotating blanket cylinder; and
- (f) whereby during less than 500 rotations of the plate cylinder and blanket cylinder of step (e) substantially all of any remaining non-image areas of the coating are removed by the blanket roll from the substrate as undissolved particles thereby forming a printing plate having an image pattern of highly polymerized, oleophilic areas and hydrophilic areas of said substrate, with highlights and shadows in the range of about 1% to about 99%.

* * * * *